United States Patent
Chiu et al.

(10) Patent No.: US 10,153,759 B2
(45) Date of Patent: Dec. 11, 2018

(54) CONTROL CHIP AND CONTROL SYSTEM UTILIZING THE SAME

(71) Applicant: VIA TECHNOLOGIES, INC., New Taipei (TW)

(72) Inventors: Hao-Hsuan Chiu, New Taipei (TW); Yen-Ting Lai, New Taipei (TW)

(73) Assignee: VIA TECHNOLOGIES, INC., New Taipei (TW)

( * ) Notice: Subject to any disclaimer, the term of this patent is extended or adjusted under 35 U.S.C. 154(b) by 4 days.

(21) Appl. No.: 14/877,509

(22) Filed: Oct. 7, 2015

(65) Prior Publication Data
US 2017/0005648 A1    Jan. 5, 2017

(30) Foreign Application Priority Data

Jul. 2, 2015   (TW) .............................. 104121444 A (51) Int. Cl.
*H03K 17/00* (2006.01)
(52) U.S. Cl.
CPC .................................. *H03K 17/002* (2013.01)
(58) Field of Classification Search
CPC .... H03K 17/693; H03K 17/005; H03K 17/74; H03K 17/6257; H04J 3/047
USPC ................................................. 327/407–408
See application file for complete search history.

(56) References Cited

U.S. PATENT DOCUMENTS

| | | | |
|---|---|---|---|
| 8,751,729 B2 | 6/2014 | Mun et al. | |
| 2005/0005045 A1* | 1/2005 | Kim | G06K 7/10297 710/74 |
| 2005/0216647 A1* | 9/2005 | Somervill et al. | 710/311 |
| 2008/0006704 A1* | 1/2008 | Kim | G06K 7/10247 235/492 |
| 2009/0268498 A1* | 10/2009 | Nomura et al. | 365/51 |
| 2015/0130700 A1 | 5/2015 | Chen et al. | |

FOREIGN PATENT DOCUMENTS

| | | |
|---|---|---|
| TW | 201232261 | 8/2012 |
| TW | 201518995 | 5/2015 |
| WO | WO 2014/076732 | 5/2014 |
| WO | WO 2014/113237 | 7/2014 |
| WO | WO 2014/116088 | 7/2014 |

OTHER PUBLICATIONS

Notice of Allowance dated May 24, 2016, issued in application No. TW 104121444.

* cited by examiner

*Primary Examiner* — Quan Tra
(74) *Attorney, Agent, or Firm* — McClure, Qualey & Rodack, LLP (57) ABSTRACT

A control chip coupled to a first input/output pin and a second input/output pin and including a first interface module, a second interface module, a first switching unit, and a control unit is provided. The first interface module includes a first pin electrically connected to the first input/output pin and a second pin. The second interface module includes a third pin. The control unit controls the first switching unit to turn on a first path between the second pin and the second input/output pin or a second path between the third pin and the second input/output pin. When the first path is turned on, the first interface module controls the voltage levels of the first and second input/output pins. When the second path is turned on, the second interface module controls the voltage level of the second input/output pin.

27 Claims, 5 Drawing Sheets

CONTROL CHIP AND CONTROL SYSTEM UTILIZING THE SAME

CROSS REFERENCE TO RELATED APPLICATIONS

This application claims priority of Taiwan Patent Application No. 104121444, filed on Jul. 2, 2015, the entirety of which is incorporated by reference herein.

BACKGROUND OF THE INVENTION

Field of the Invention

The invention relates to a control chip, and more particularly to a control chip which is capable of communicating with an external chip according to different communication protocols.

Description of the Related Art

Generally, a host is capable of utilizing a transmission line to communicate with an external device. The host may supply power or data to the external device. The host usually includes many chips to generate power or data to the external device. However, the communication protocols between the chips are not the same. Therefore, the manufacturer manufacturing a motherboard must combine many chips to provide many interfaces to the external device. However, the interfaces occupy a lot of space in the motherboard, which reduces the amount of usable space in the motherboard.

BRIEF SUMMARY OF THE INVENTION

In accordance with an embodiment, a control chip is coupled to a first external chip via a first input/output pin and a second input/output pin and includes a first interface module, a second interface module, a first switching unit, and a control unit. The first interface module includes a first pin and a second pin. The first pin is electrically connected to the first input/output pin. The second interface module includes a third pin. The first switching unit provides a first path between the second pin and the second input/output pin, provides a second path between the third pin and the second input/output pin, and turns on the first or the second path according to a first control signal. The control unit generates the first control signal. When the first path is turned on, the first interface module controls the voltage levels of the first and second input/output pins. When the second path is turned on, the second interface module controls the voltage level of the second input/output pin.

In accordance with a further embodiment, a control device includes a connection port, a first external chip and a control chip. The connection port is configured to couple to an external device. The first external chip communicates with the external device via the connection port. The control chip is coupled to the first external chip via a first input/output pin and a second input/output pin and includes a first interface module, a second interface module, a first switching unit, and a control unit. The first interface module includes a first pin and a second pin, wherein the first pin is electrically connected to the first input/output pin. The second interface module includes a third pin. The first switching unit provides a first path between the second pin and the second input/output pin, provides a second path between the third pin and the second input/output pin, and turns on the first or the second path according to a first control signal. The control unit generates the first control signal. When the first path is turned on, the first interface module controls the voltage levels of the first and second input/output pins. When the second path is turned on, the second interface module controls the voltage level of the second input/output pin.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
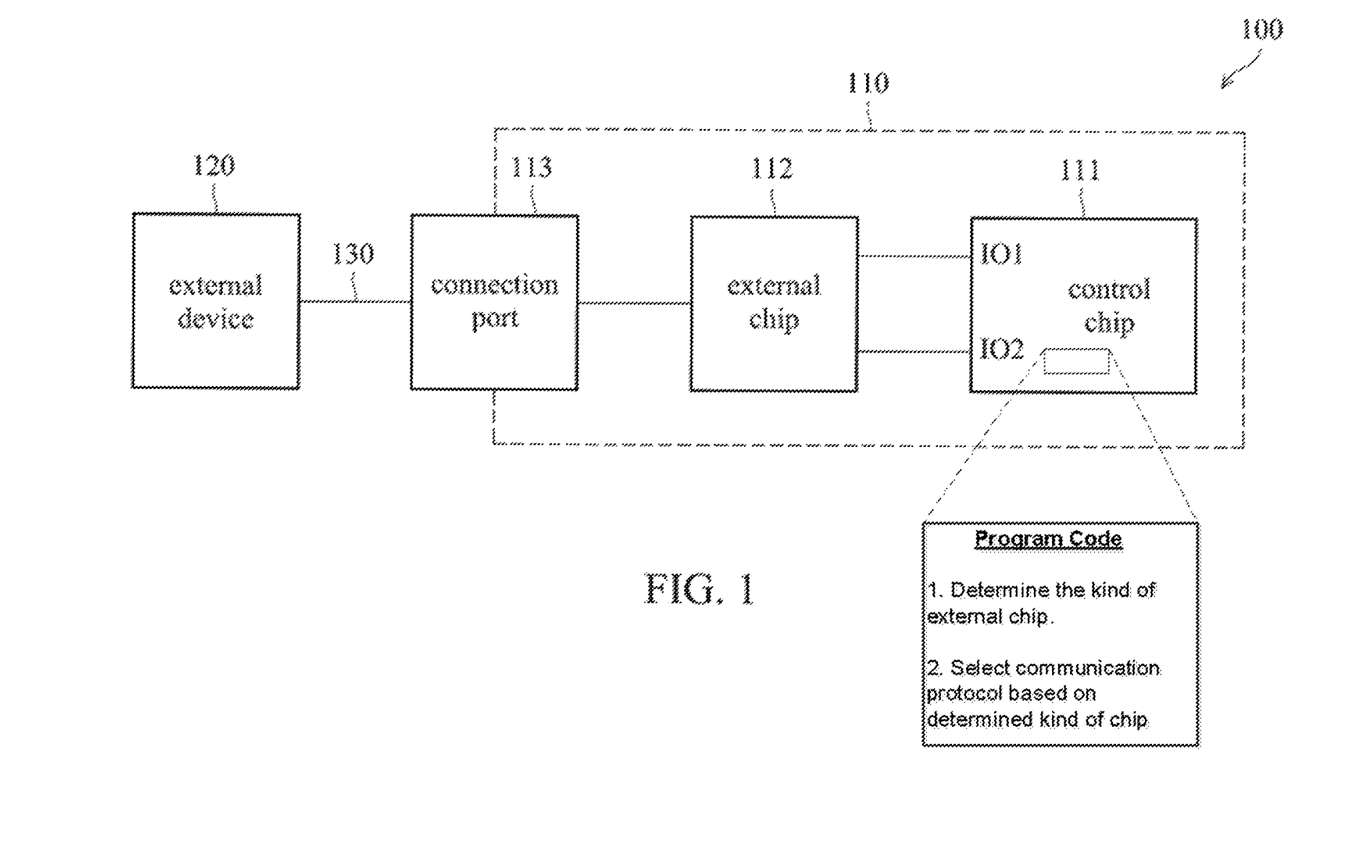
FIG. 1 is a schematic diagram of an exemplary embodiment of a control system, in accordance with an embodiment of invention.

FIG. 1 is a schematic diagram of an exemplary embodiment of a control system, in accordance with an embodiment of invention. As shown in FIG. 1, the control system 100 includes a control device 110 and an external device 120. The control device 110 is coupled to the external device 120 via a transmission line 130 to transmit data and power. The invention does not limit the kind of transmission line 130 used. In one embodiment, the transmission line 130 is a USB transmission line.

The control device 110 includes a control chip 111, an external chip 112, and a connection port 113. As shown in FIG. 1, the control chip 111 is coupled to the external chip 112 via the input/output pins IO1 and IO2, but the disclosure is not limited thereto. In some embodiment, the control chip 111 is coupled to the external chip 112 via three or more input/output pins.

In this embodiment, the control chip 111 is capable of selectively utilizing the input/output pins IO1 and IO2 to communicate with the external chip 112 or only utilizing the input/output pin IO2 to communicate with the external chip 112. For example, the manufacturer who manufactures the control device 110 determines the kind of external chip 112 that will be used in advance. Therefore, the manufacturer can store program code in the control chip 111 in advance. The control chip 111 is capable of determining the kind of external chip 112 based on the pre-stored program code.

Assuming that when the program code is executed by the control chip 111, the control chip 111 discovers that the external chip 112 is the first kind of chip. Therefore, the control chip 111 utilizes the input/output pins IO1 and IO2 to communicate with the external chip 112 according to a first communication protocol. In this case, the external chip 112 may be a power switch or a power regulator, but the disclosure is not limited thereto.

In another embodiment, when the program code is executed by the control chip 111, the control chip 111 discovers that the external chip 112 is the second kind of chip. Therefore, the control chip 111 utilizes the input/output pin IO2 to communicate with the external chip 112 according to a second communication protocol. In this case, the external chip 112 may be a chip which supports an Inter-Integrated Circuit (I2C) protocol, but the disclosure is not limited. In this embodiment, the input/output pin IO2 serves as a sharing pin. In other words, when the control chip 111 utilizes the first and second communication protocols to communicate with the external chip 112, the input/output pin IO2 is utilized by the control chip 111.

The connection port 113 is coupled to the external chip 112 to transmit data or power between the external device 120 and the external chip 112. In one embodiment, the connection port 113 is a USB 3.0 Type-C connector, but the disclosure is not limited thereto.

Figure 2A:
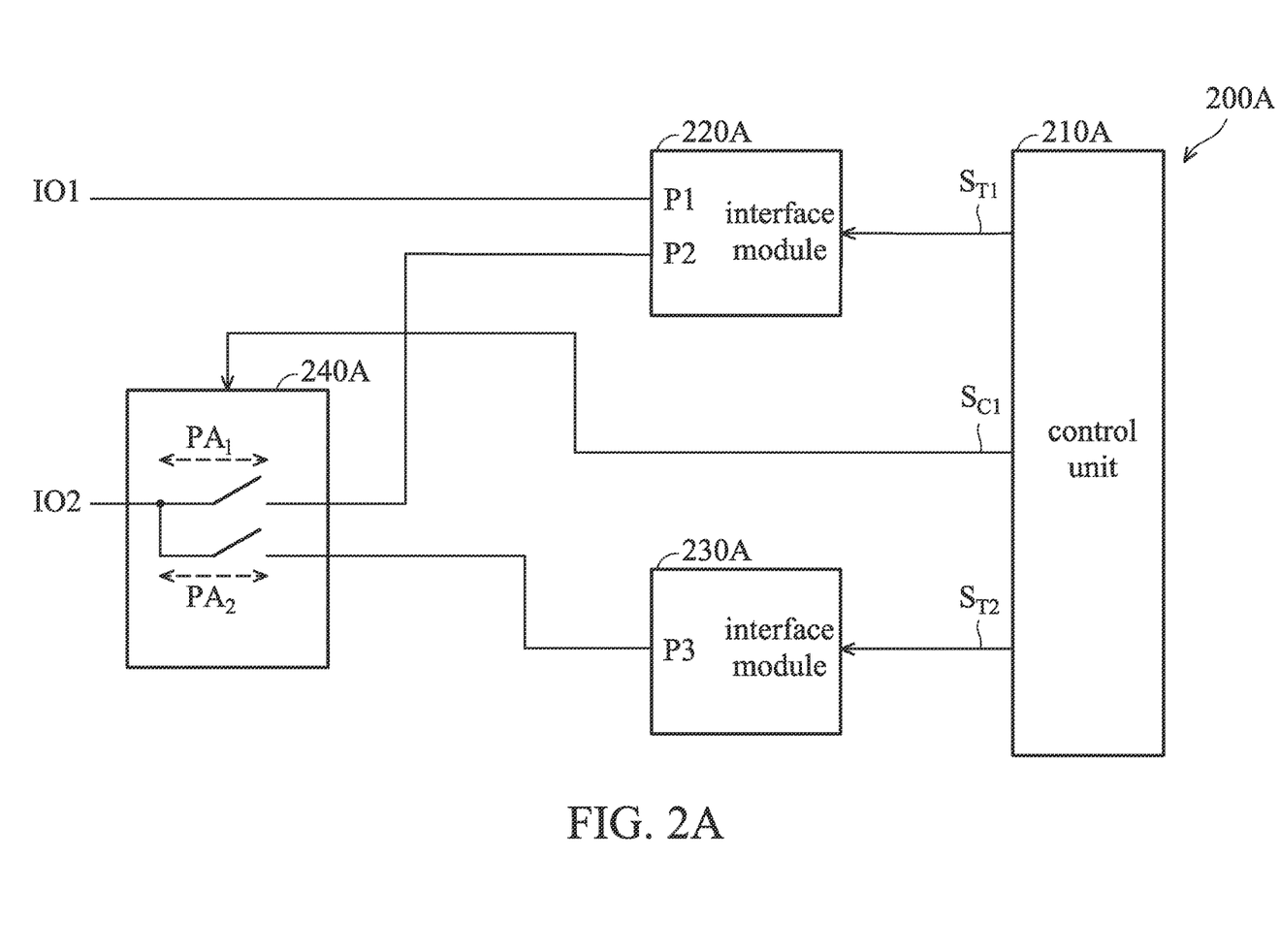
FIG. 2A is a schematic diagram of an exemplary embodiment of a control chip, in accordance with an embodiment of invention.

FIG. 2A is a schematic diagram of an exemplary embodiment of a control chip, in accordance with an embodiment of invention. As shown in FIG. 2A, the control chip 200A includes a control unit 210A, interface modules 220A and 230A, and a switching unit 240A. The control unit 210A activates the corresponding interface module according to program code stored in an internal storage unit (not shown) or an external storage unit (not shown) to control the voltage levels of the input/output pins IO1 and IO2. In one embodiment, the control unit 210A can be served a hub controller, but the disclosure is not limited thereto.

The interface module 220A receives a trigger signal $S_{T1}$ and includes pins P1 and P2. The pin P1 is coupled to the input/output pin IO1. The pin P2 is coupled to the switching unit 240A. The invention does not limit the kind of interface module 220A. In one embodiment, the interface module 220A is a power controller I/F logic circuit. The power controller I/F logic circuit controls the voltage levels of the input/output pins IO1 and IO2 via the switching unit 240A to provide signals of a power controller I/F logic to the external chip 112.

The interface module 230A receives a trigger signal $S_{T2}$ and includes a pin P3. The pin P3 is coupled to the switching unit 240A. When the interface module 230A is activated, the interface module 230A controls the voltage level of the input/output pin IO2 via the switching unit 240A. The invention does not limit the circuit structure of interface module 230A. In one embodiment, the number of input/output pins controlled by the interface module 230A is less than the number of input/output pins controlled by the interface module 220A.

The switching unit 240A receives a control signal $S_{C1}$ and turns on or off the paths $PA_1$ and $PA_2$ according to the control signal $S_{C1}$. As shown in FIG. 2A, the path $PA_1$ is formed between the pin P2 and the input/output pin IO2, and the path $PA_2$ is formed between the pin P3 and the input/output pin IO2. In one embodiment, the switching unit 240A is a multiplexer, but the disclosure is not limited.

The control unit 210A activates the interface module 220A or 230A according to program code stored in a register disposed in the control unit 210 or out of the control unit 210. In one embodiment, when the control unit 210A desires to activate the interface module 220A according to the program code, the control unit 210A utilizes the control signal $S_{C1}$ to turn on the path $PA_1$ and then sends the trigger signal $S_{T1}$ to activate the interface module 220A. Therefore, the interface module 220A controls the voltage levels of the input/output pins IO1 and IO2. In another embodiment, when the control unit 210A desires to activate the interface module 230A according to the program code, the control unit 210A utilizes the control signal $S_{C1}$ to turn on the path $PA_2$ and then sends the trigger signal $S_{T2}$ to activate the interface module 230A. Therefore, the interface module 230A controls the voltage level of the input/output pin IO2.

Figure 2B:
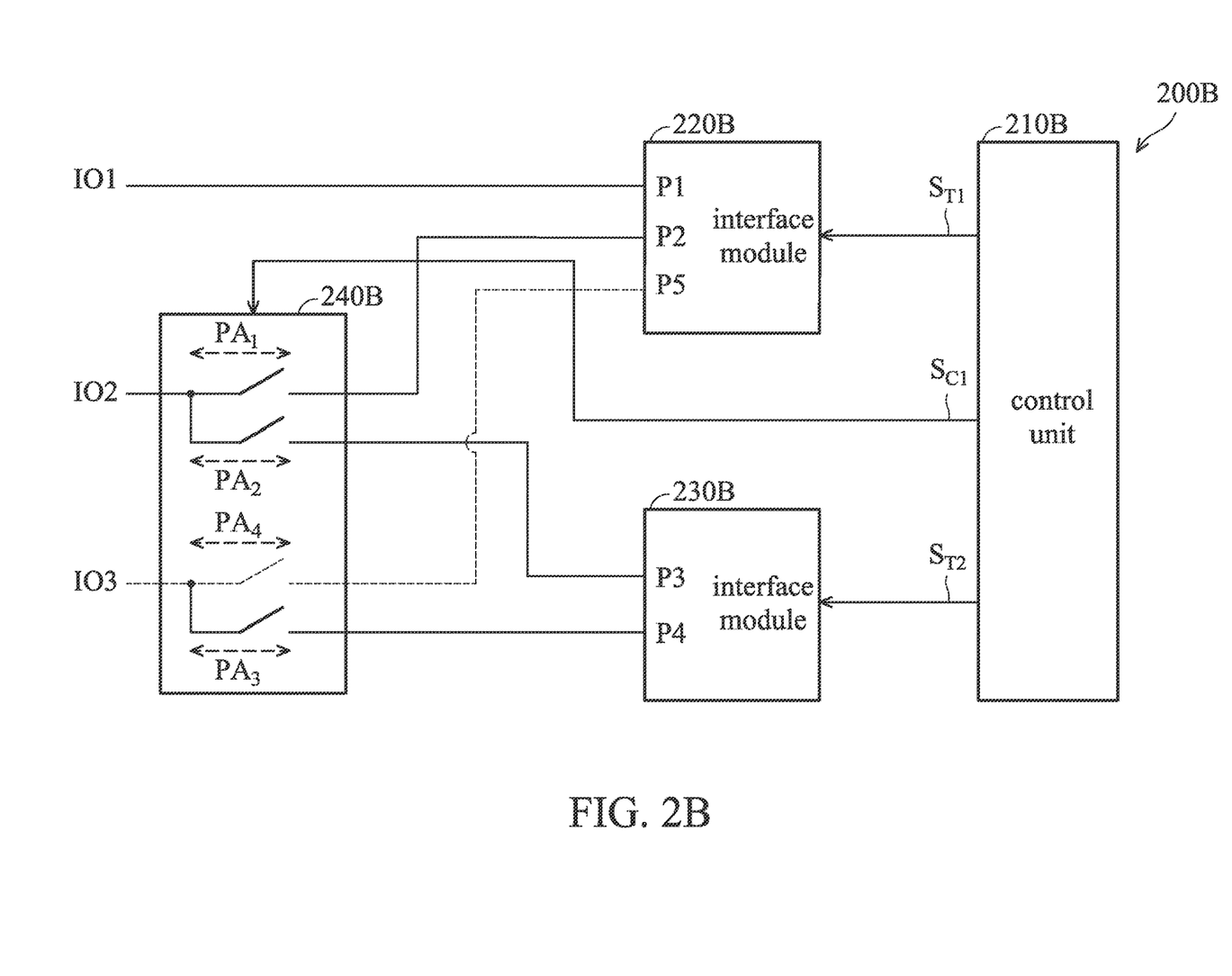
FIG. 2B is a schematic diagram of another exemplary embodiment of a control chip, in accordance with an embodiment of invention.

FIG. 2B is a schematic diagram of an exemplary embodiment of a control chip, in accordance with an embodiment of invention. FIG. 2B is similar to FIG. 2A, with the exception that the control chip 200B is coupled to an external chip via three input/output pins IO1~IO3. As shown in FIG. 2B, the switching unit 240B provides a path $PA_3$ between the input/output pin IO3 and the pin P4 of the interface module 230B and turns on or off the path $PA_3$ according to the control signal $S_{C1}$. In one embodiment, when the switching unit 240B turns on the paths $PA_2$ and $PA_3$ according to the control signal $S_{C1}$, the voltage levels of the input/output pins IO2 and IO3 are controlled by the interface module 230B. In one embodiment, the interface module 230B controls the voltage levels of the input/output pins IO2 and IO3 according to the I2C protocol.

In another embodiment, the switching unit 240B provides a path $PA_4$ between the input/output pin IO3 and the pin P5 of the interface module 220B and turns on or off the path $PA_4$ according to the control signal $S_{C1}$. When the switching unit 240B turns on the paths $PA_1$ and $PA_4$ according to the control signal $S_{C1}$, the voltage levels of the input/output pins IO1~IO3 are controlled by the interface module 220B.

Figure 3:
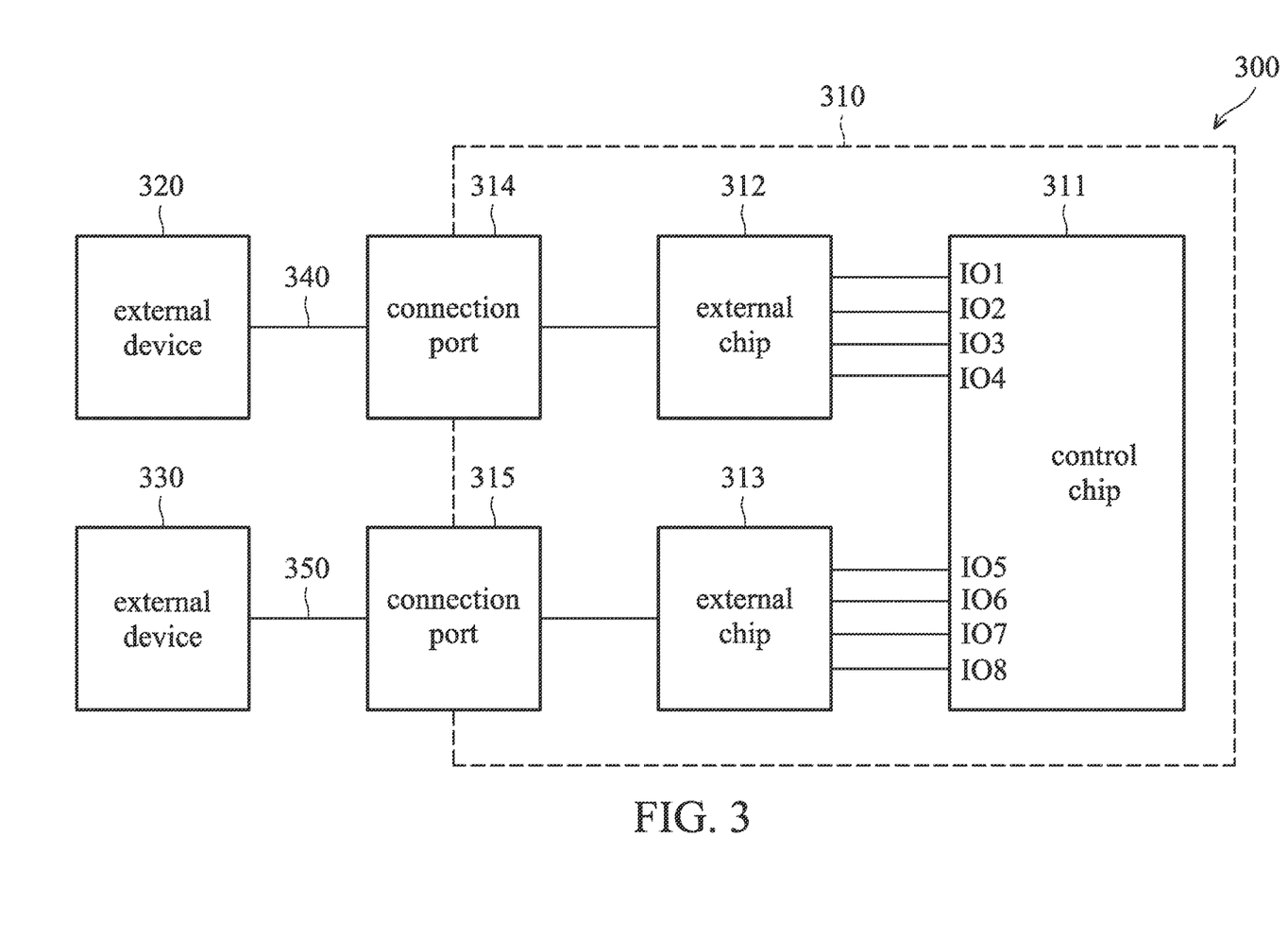
FIG. 3 is a schematic diagram of another exemplary embodiment of a control system, in accordance with an embodiment of invention.

FIG. 3 is a schematic diagram of another exemplary embodiment of a control system, in accordance with an embodiment of invention. In this embodiment, the control system 300 includes a control device 310 and external devices 320 and 330, but the disclosure is not limited thereto. In some embodiments, the number of external devices is greater than 3. As shown in FIG. 3, the control device 310 communicates with the external device 320 via the transmission line 340 and communicates with the external device 330 via the transmission line 350 to transmit data and power. In one embodiment, the transmission lines 340 and 350 are USB connection lines, but the disclosure is not limited thereto. In some embodiments, the kind of transmission line 340 is different from the kind of transmission line 350.

The control device 310 includes a control chip 311, external chips 312 and 313, and connection ports 314 and 315. The control chip 311 is coupled to the external chip 312 via the input/output pins IO1~IO4. The external chip 312 is coupled to the connection port 314 and provides data and/or power to the external device 320 via the transmission line 340. In this embodiment, the control chip 311 is coupled to the external chip 313 via the input/output pins IO5~IO8. The external chip 313 is coupled to the connection port 315 and provides data and/or power to the external device 330 via the transmission line 350.

In this embodiment, the control chip 311 is coupled to a single external chip via four input/output pins, but the disclosure is not limited thereto. In other embodiments, the control chip 311 is coupled to an external chip via at least one input/output pin. Furthermore, in some embodiments, the number of input/output pins which are utilized by the control chip 311 to couple to the external chip 312 is different from the number of input/output pins which are utilized by the control chip 311 to couple to the external chip 313.

The control chip 311 determines the kind of communication protocol between the external chip 312 and the control chip 311 and the kind of communication protocol between the external chips 313 and the control chip 311 according to program code stored in the control chip 311. In one embodiment, when each of the communication protocols between the control chip 311 and the external chip 312 and between the control chip 311 and the external chip 313 is a first communication protocol, the control chip 311 communicates with the external chip 312 via the input/output pins IO1~IO4 and communicates with the external chip 313 via the input/output pins IO5~IO8

In another embodiment, assuming that the communication protocol between the control chip 311 and the external chip 312 is the first communication protocol, and the communication protocol between the control chip 311 and the external chip 313 is a second communication protocol. The control chip 311 communicates with the external chip 312 via the input/output pins IO1~IO4 and communicates with the external chip 313 via the input/output pins IO5~IO6.

In some embodiments, each of the communication protocols between the control chip 311 and the external chip 312 and between the control chip 311 and the external chip 313 is the second communication protocol, the control chip 311 communicates with the external chip 312 via the input/output pins IO3~IO4 and communicates with the external chip 313 via the input/output pins IO5~IO6. In this embodiment, the input/output pins IO3~IO6 are sharing pins. Regardless of whether the communication protocol between the control chip 311 and the external chip 312 or the communication protocols between the control chip 311 and the external chip 313 is the first or the second communication protocol, the input/output pins IO3~IO6 are utilized by the control chip 311.

Figure 4:
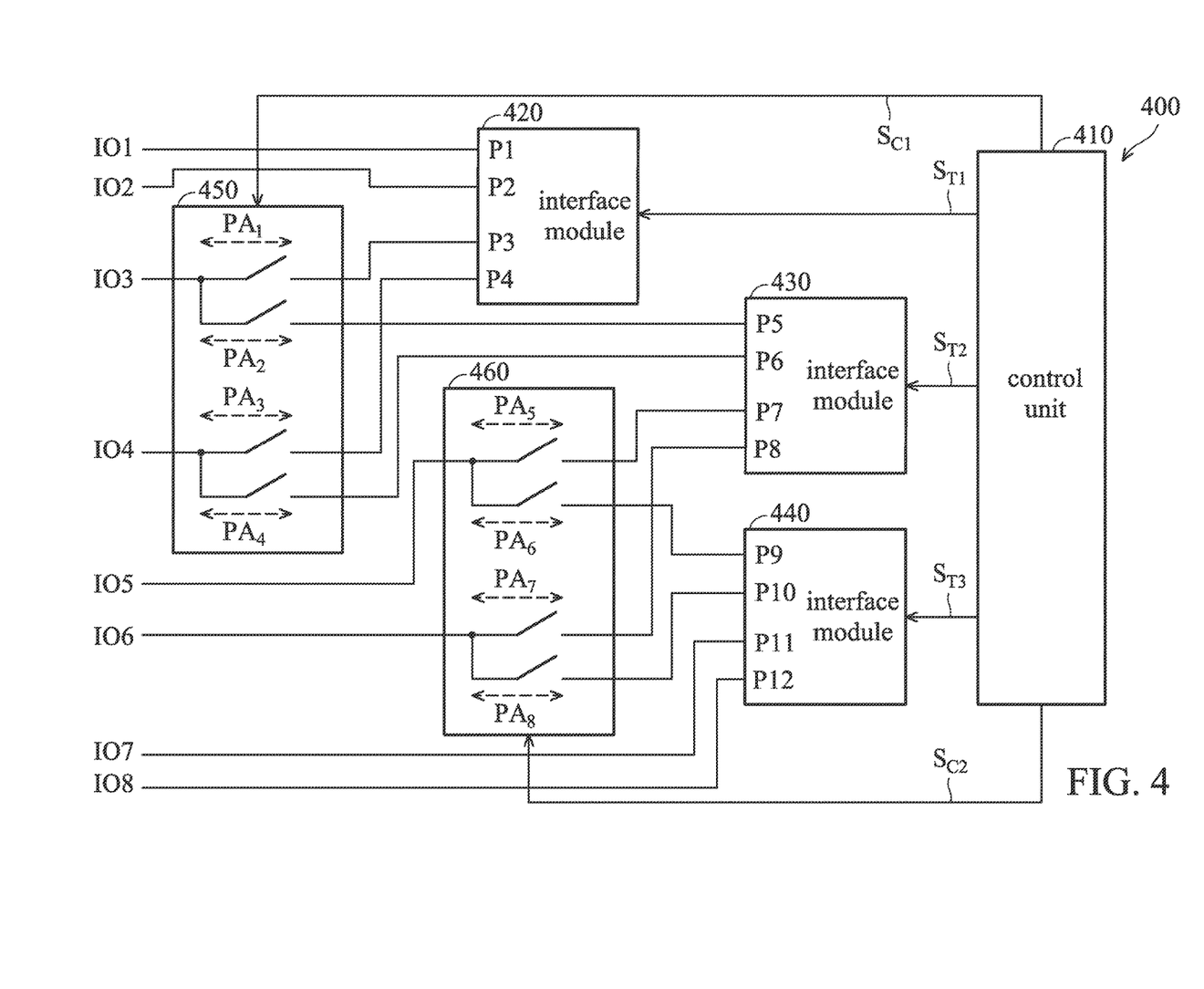
FIG. 4 is a schematic diagram of another exemplary embodiment of a control chip, in accordance with an embodiment of invention.

FIG. 4 is a schematic diagram of another exemplary embodiment of a control chip, in accordance with an embodiment of invention. As shown in FIG. 4, the control chip 400 includes a control unit 410, interface modules 420~440, and the switching units 450 and 460. The interface module 420 receives the trigger signal $S_{T1}$ and includes pins P1~P4. The pin P1 is coupled to the input/output pin IO1. The pin P2 is coupled to the input/output pin IO2. The pins P3 and P4 are coupled to the switching unit 450. In one embodiment, the interface module 420 is a power control logic circuit to provide power control signals.

The interface module 430 receives the trigger signal $S_{T2}$ and includes pins P5~P8. The pins P5 and P6 are coupled to the switching unit 450. The pins P7 and P8 are coupled to the switching unit 460. In one embodiment, the interface module 430 has I2C to provide two signal groups.

The interface module 440 receives the trigger signal $S_{T3}$ and includes pins P9~P12. The pins P9 and 10 are coupled to the switching unit 460. The pin P11 is coupled to the input/output pin IO7. The pin P12 is coupled to the input/output pin IO8. In one embodiment, interface module 440 is the same kind as interface module 420. For example, the interface modules 420 and 440 are power control logic circuits.

The switching unit 450 controls the path $PA_1$~$PA_4$ according to the control signal $S_{C1}$. As shown in FIG. 4, the path $PA_1$ has occurred between the input/output pin IO3 and the pin P3, the path $PA_2$ has occurred between the input/output pin IO3 and the pin P5, the path $PA_3$ has occurred between the input/output pin IO4 and the pin P4, and the path $PA_4$ has occurred between the input/output pin IO4 and the pin P6. In one embodiment, the switching unit 450 is a multiplexer, but the disclosure is not limited thereto.

The switching unit 460 controls the path $PA_5$~$PA_8$ according to the control signal $S_{C2}$. As shown in FIG. 4, the path $PA_5$ has occurred between the input/output pin IO5 and the pin P7, the path $PA_6$ has occurred between the input/output pin IO5 and the pin P9, the path $PA_7$ has occurred between the input/output pin IO6 and the pin P8, and the path $PA_8$ has occurred between the input/output pin IO6 and the pin P10. In one embodiment, the switching unit 460 is a multiplexer, but the disclosure is not limited thereto.

The control unit 410 generates the control signal SC1 and SC2 according to program code stored in a register designed to be disposed inside the control unit 410 or outside of the control unit 410. For example, when the control chip 400 receives power, the control chip 400 loads the values of the register within an external memory to control the switching units 450 and 460.

In one embodiment, the control unit 410 utilizes the control signals $S_{C1}$ and $S_{C2}$ to turn on the paths $PA_1$, $PA_3$, $PA_6$, and $PA_8$ and turn off the paths $PA_2$, $PA_4$, $PA_5$, and $PA_7$. At this time, the control unit 410 utilizes the trigger signals $S_{T1}$ and $S_{T3}$ to activate the interface modules 420 and 440 such that the voltage levels of the input/output pins IO1~IO4 are controlled by the interface module 420 and the voltage levels of the input/output pins IO5~IO8 are controlled by the interface module 440.

In another embodiment, the control unit 410 utilizes the control signals $S_{C1}$ and $S_{C2}$ to turn on the paths $PA_2$, $PA_4$, $PA_5$, and $PA_7$ and turn off the paths $PA_1$, $PA_3$, $PA_6$, and $PA_8$. At this time, the control unit 410 utilizes the trigger signal $S_{T2}$ to activate the interface module 430 such that the voltage levels of the input/output pins IO3~IO6 are controlled by the interface module 430.

In some embodiments, the control unit 410 utilizes the control signals $S_{C1}$ and $S_{C2}$ to turn on the paths $PA_1$, $PA_3$, $PA_5$, and $PA_7$ and turn off the paths $PA_2$, $PA_4$, $PA_6$, and $PA_8$. When the control unit 410 utilizes the trigger signals $S_{T1}$ and $S_{T2}$ to activate the interface modules 420 and 430, the voltage levels of the input/output pins IO1~IO4 are controlled by the interface module 420 and the voltage levels of the input/output pins IO5~IO6 are controlled by the interface module 430. Similarly, when the paths $PA_2$, $PA_4$, $PA_6$, and $PA_8$ are turned on and the paths $PA_1$, $PA_3$, $PA_5$, and $PA_7$ are turned off, the control unit 410 utilizes the trigger signals $S_{T2}$ and $S_{T3}$ to activate the interface modules 430 and 440. Therefore, the voltage levels of the input/output pins IO3~IO4 are controlled by the interface module 430, and the voltage levels of the input/output pins IO5~IO8 are controlled by the interface module 440.

The above designs are utilized to share some input/output pins (e.g. IO2 shown in FIG. 1 or IO3~IO6 shown in FIG. 3) and transmit signals with different protocols via the shared input/output pins. Since the external chip utilizes the shared input/output pins to receive signals with different protocols, it is not required to increase the number of input/output pins. Therefore, the manufacturing cost of the chip is reduced and the usable space of the chip is increased.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A USB control chip for coupling to a first external chip via a first input/output pin and a second input/output pin, the USB control chip comprising:
   a first interface module having a first pin and a second pin, wherein the first pin is electrically connected to the first input/output pin;
   a second interface module having a third pin;
   a first switching unit configured to: provide a first path between the second pin and the second input/output pin, provide a second path between the third pin and the second input/output pin, and turn on the first or the second path according to a first control signal;
   a control unit configured to generate the first control signal, wherein when the first path is turned on, the first interface module controls the voltage levels of the first and second input/output pins, and when the second path is turned on, the second interface module controls the voltage level of the second input/output pin, wherein the first interface module is a power controller I/F logic circuit; and
   a memory storing program code configured to determine a kind of chip that the first external chip is, and further configured to select a protocol for communicating with the first external chip based upon the kind of chip that it is determined to be;
   wherein the second input/output pin is a common pin of the first interface and the second interface, where the first interface module has a different interface with the second interface module, and
   wherein when the first external chip is a first kind of chip, the USB control chip is configured to utilize the first and second input/output pins to communicate with the first external chip such that the first external chip receives the voltage levels of the first and second input/output pins and provides power to an external device according to the voltage levels of the first and second input/output pins.

2. The USB control chip as claimed in claim 1, further comprising:
   a third input/output pin, wherein the first switching unit provides a third path between the third input/output pin and a fourth pin of the second interface module and turns on the third path according to the first control signal, and when the second and third paths are turned on, the second interface module controls the voltage levels of the second and third input/output pins according to an Inter-Integrated Circuit (I2C) protocol.

3. The USB control chip as claimed in claim 2, wherein the first switching unit provides a fourth path between the third input/output pin and a fifth pin of the first interface module and turns on the fourth path according to the first control signal, and when the first and fourth paths are turned on, the first interface module controls the voltage levels of the first, second and third input/output pins.

4. The USB control chip as claimed in claim 1, further comprising:
   a third interface module comprising a fourth pin and a fifth pin, wherein the fourth pin is electrically connected to a third input/output pin; and
   a second switching unit providing a third path between the fifth pin and a fourth input/output pin, providing a fourth path between a sixth pin of the second interface module and the fourth input/output pin, and turning on the third or the fourth path according to a second control signal generated from the control unit,
   wherein when the third path is turned on, the third interface module controls the voltage levels of the third and fourth input/output pins, and when the fourth path is turned on, the second interface module controls the voltage level of the fourth input/output pin.

5. The USB control chip as claimed in claim 4, wherein the control unit utilizes the first and second control signals to turn on the first and third paths and turn off the second and fourth paths.

6. The USB control chip as claimed in claim 4, wherein the control unit utilizes the first and second control signals to turn on the second and fourth paths and turn off the first and third paths.

7. The USB control chip as claimed in claim 4, wherein the control unit utilizes the first and second control signals to turn on the first and fourth paths and turn off the second and third paths.

8. The USB control chip as claimed in claim 4, wherein the third and fourth input/output pins are coupled to a second external chip.

9. A USB control device coupled to an external device and comprising:
   a connection port configured to couple to the external device;
   a first external chip configured to communicate with the external device via the connection port; and
   a control chip coupled to the first external chip via a first input/output pin and a second input/output pin and comprising:
   a first interface module having a first pin and a second pin, wherein the first pin is electrically connected to the first input/output pin;
   a second interface module having a third pin;
   a first switching unit configured to: provide a first path between the second pin and the second input/output pin, provide a second path between the third pin and the second input/output pin, and turn on the first or the second path according to a first control signal;
   a control unit configured to generate the first control signal, wherein when the first path is turned on, the first interface module controls the voltage levels of the first and second input/output pins, and when the second path is turned on, the second interface module controls the voltage level of the second input/output pin, wherein the first interface module is a power controller I/F logic circuit; and
   a memory storing program code configured to determine a kind of chip that the first external chip is, and further configured to select a protocol for communicating with the first external chip based upon the kind of chip that it is determined to be;
   wherein the second input/output pin is a common pin of the first interface and the second interface, where the first interface module has a different interface with the second interface module, and
   wherein when the first external chip is a first kind of chip, the control chip is configured to utilize the first and second input/output pins to communicate with the first external chip such that the first external chip receives the voltage levels of the first and second input/output pins and provides power to the external device according to the voltage levels of the first and second input/output pins.

10. The USB control device as claimed in claim 9, wherein the control chip is further coupled to the first external chip via a third input/output pin, the first switching unit provides a third path between the third input/output pin and a fourth pin of the second interface module and turns on the third path according to the first control signal, and when the second and third paths are turned on, the second interface module controls the voltage levels of the second and third input/output pins according to an Inter-Integrated Circuit (I2C) protocol.

11. The USB control device as claimed in claim 10, wherein the first switching unit provides a fourth path between the third input/output pin and a fifth pin of the first interface module and turns on the fourth path according to the first control signal, and when the first and fourth paths are turned on, the first interface module controls the voltage levels of the first, second and third input/output pins.

12. The USB control device as claimed in claim 9, wherein the control chip further comprises:
  a third interface module comprising a fourth pin and a fifth pin, wherein the fourth pin is electrically connected to a third input/output pin; and
  a second switching unit providing a third path between the fifth pin and a fourth input/output pin, providing a fourth path between a sixth pin of the second interface module and the fourth input/output pin, and turning on the third or the fourth path according to a second control signal generated from the control unit,
  wherein when the third path is turned on, the third interface module controls the voltage levels of the third and fourth input/output pins, and when the fourth path is turned on, the second interface module controls the voltage level of the fourth input/output pin.

13. The USB control device as claimed in claim 12, wherein the control unit utilizes the first and second control signals to turn on the first and third paths and turn off the second and fourth paths.

14. The USB control device as claimed in claim 12, wherein the control unit utilizes the first and second control signals to turn on the second and fourth paths and turn off the first and third paths.

15. The USB control device as claimed in claim 12, wherein the control unit utilizes the first and second control signals to turn on the first and fourth paths and turn off the second and third paths.

16. The USB control device as claimed in claim 12, further comprising:
  a second external chip coupled to the third and fourth input/output pins.

17. The USB control device as claimed in claim 9, wherein the connection port is a USB 3.0 Type-C connector.

18. The USB control device as claimed in claim 9, wherein the first external chip is a power switch or a power regulator.

19. The USB control device as claimed in claim 9, wherein the control unit comprises a register storing program code, and the control unit executes the program code to generate the first control signal.

20. The USB control device as claimed in claim 9, wherein the control unit is a hub controller.

21. The USB control chip as claimed in claim 1, wherein the first interface module utilizes the first and second pins to communicate with the first external chip according to a first communication protocol, and the second interface module utilizes the third pin to communicate with the first external chip according to a second communication protocol.

22. The USB control chip as claimed in claim 1, wherein the control unit is a hub controller.

23. The USB control chip as claimed in claim 1, wherein the control unit generates the first control signal without depending on the signals on the first and second input/output pins.

24. The USB control device as claimed in claim 9, wherein the first interface module utilizes the first and second pins to communicate with the first external chip according to a first communication protocol, and the second interface module utilizes the third pin to communicate with the first external chip according to a second communication protocol.

25. The USB control device as claimed in claim 9, wherein the control unit generates the first control signal without depending on the signals on the first and second input/output pins.

26. The USB control chip as claimed in claim 1, wherein when the first external chip is a first kind of chip, the USB control chip utilizes the first and second input/output pins to communicate with the first external chip simultaneously, and
  wherein when the first external chip is a second kind of chip, the USB control chip utilizes the second input/output pin to communicate with the first external chip and the USB control chip does not utilize the first input/output pin to communicate with the first external chip.

27. The USB control chip as claimed in claim 1, wherein when the first external chip is a second kind of chip, the USB control chip utilizes the second input/output pin to communicate with the first external chip such that the first external chip receives the voltage level of the second input/output pin and provides power to the external device according to the voltage level of the second input/output pin.

* * * * *